United States Patent
Chang et al.

(10) Patent No.: US 7,459,344 B2
(45) Date of Patent: Dec. 2, 2008

(54) METHOD FOR FORMING MICROMACHINED STRUCTURE

(75) Inventors: Chia-Hua Chang, Pingtung County (TW); Hua-Shu Wu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 122 days.

(21) Appl. No.: 11/463,629

(22) Filed: Aug. 10, 2006

(65) Prior Publication Data

US 2008/0038859 A1    Feb. 14, 2008

(51) Int. Cl.
*H01L 21/00* (2006.01)
(52) U.S. Cl. .................. 438/118; 438/119; 438/48; 257/225
(58) Field of Classification Search ............... 438/729, 438/437, 124, 455, 48; 257/225
See application file for complete search history.

(56) References Cited

U.S. PATENT DOCUMENTS

| | | | |
|---|---|---|---|
| 6,221,738 B1 * | 4/2001 | Sakaguchi et al. | 438/455 |
| 6,743,653 B2 * | 6/2004 | Tanabe et al. | 438/48 |
| 2005/0048736 A1 * | 3/2005 | Kerdiles et al. | 438/455 |

* cited by examiner

*Primary Examiner*—Ha Tran T Nguyen
*Assistant Examiner*—Chakila Tillie
(74) *Attorney, Agent, or Firm*—Thomas, Kayden, Horstemeyer & Risley

(57) ABSTRACT

The invention provides a method of fabricating a micromachined structure, and in particular to a method of forming a micro-electro-mechanical system (MEMS) structure. A thin silicon cantilevered or suspended structure used to make micromachined structures is first formed from a SOI wafer or a bulk silicon wafer, followed by formation of the micromachined structures by semiconductor manufacturing techniques.

23 Claims, 7 Drawing Sheets

METHOD FOR FORMING MICROMACHINED STRUCTURE

BACKGROUND

The present invention relates to a method of forming a micromachined structure, and in particular to a method of forming a micro-electro-mechanical system (MEMS) structure.

In recent years, micromachined devices, such as micromirror devices, microswitches, microactuators and the like, having small movable structures, have been gradually developed in many applications. Particularly, in the case of forming micromachined devices using technologies for semiconductor integrated circuits, such as those which include photolithographic processing, micromachined structures can be reproduced accurately. Thereby, the micromachined structures can be arrayed easily on a substrate, produced at low cost, and respond quicker than structures produced by prior techniques because of their reduced size.

Generally, movable micromachined structures can be actuated by electrostatic force, magnetic force or Van der Waals' force, etc., depending on choice of shapes and compositions. The micromachined structures can be realized by bulk micromachining or surface micromachining process using semiconductor IC manufacturing techniques of mass production at low cost and miniature size.

While micromachined structures are formed from a processing wafer or layer, the processing wafer or layer should be thin enough for the micromachined structures to respond quickly. However, it is noted that such thin processing wafers or layers are usually floppy and fragile.

SUMMARY

Accordingly, the invention provides a method of forming a micromachined structure, and in particular a method of forming a micro-electro-mechanical system (MEMS) structure.

The invention provides a method for forming a micromachined structure, comprising: providing a substrate, such as a wafer, having an intermediate layer interposed between a first layer and a second layer, patterning a free surface on the second layer, adhering the patterned free surface of the second layer to a first handle substrate, such as a first handle wafer, via a first adhesive layer, removing the first layer, removing the intermediate layer to expose a surface of the second layer, releasing the first adhesive layer and the first handle substrate from the patterned free surface of the second layer, bonding the patterned free surface of the second layer to a substrate, such as a wafer or a glass substrate, with integrate circuit devices, so as to form the micromachined structure thereon.

The invention also provides a method for forming a micromachined structure, comprising: providing a processing substrate, such as a wafer, providing a handle substrate, such as a handle wafer, adhering the processing substrate to the handle substrate via an adhesive layer, thinning the processing substrate, patterning a free surface on the processing substrate, bonding the patterned free surface of the processing substrate to a supporting substrate, such as a wafer or a glass substrate, with integrate circuit devices, releasing the adhesive layer and the handle substrate from the processing substrate, so as to form the micromachined structure thereon.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DESCRIPTION

The invention discloses a method of forming a micromachined structure, and in particular to a method of forming a micro-electro-mechanical system (MEMS) structure. FIGS. 1A~1F demonstrate a method known to the inventor of forming a thin suspended structure which can be used to make micromachined structures. This is not prior art for the purposes of determining the patentability of the invention. This merely shows a problem found by the inventor.

Figure 1A:
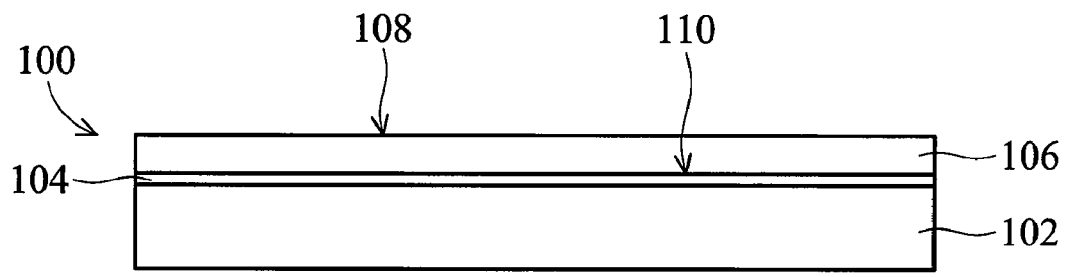
FIGS. 1A~1F are a series of schematic cross-sections of a method of forming a thin suspended structure known to the inventor.

As shown in FIG. 1A, a silicon-on-insulator (SOI) wafer 100 having an insulator layer 104 interposed between a first silicon layer 102 and a second silicon layer 106 is first provided. The second silicon layer 106 has a free surface 108 and a substantially co-planar surface 110 abutting the insulator layer 104. The insulator layer 104 may comprise an oxide layer, such as silicon oxide.

Figure 1B:
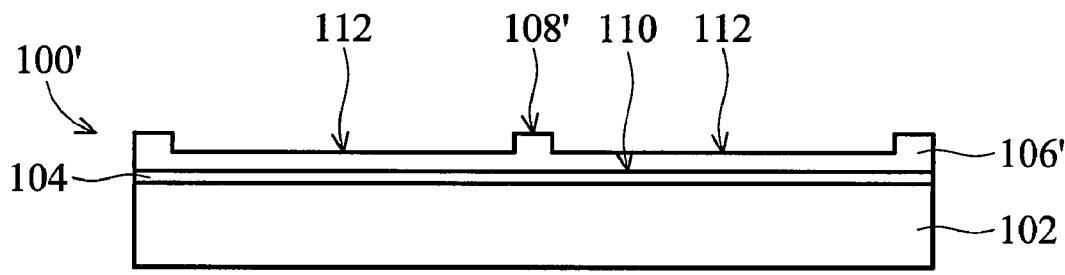

Referring to FIG. 1B, the free surface 108 of the second silicon layer 106 is patterned by photolithography and etching techniques known to those skilled in the art, such that recesses 112 are formed in the patterned free surface 108' of the second silicon layer 106' of the SOI wafer 100'.

Figure 1C:
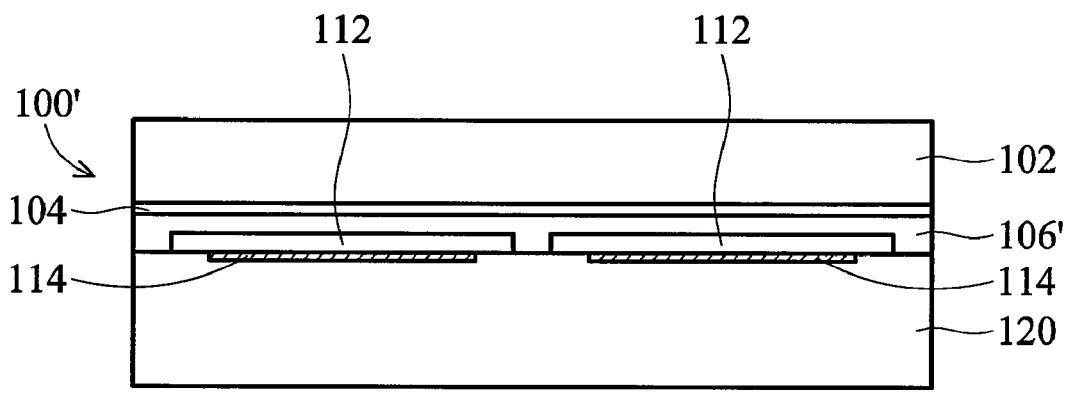

In FIG. 1C, a substrate 120, such as a wafer or glass substrate with integrated circuit devices 114 or the like therein or thereon, is provided. The patterned free surface 108' of the silicon layer 106' is then bonded to the substrate 120, using an appropriate method such as surface-active bonding (SAB), anodic bonding, adhesives, heat bonding, or any other suitable means.

Figure 1D:
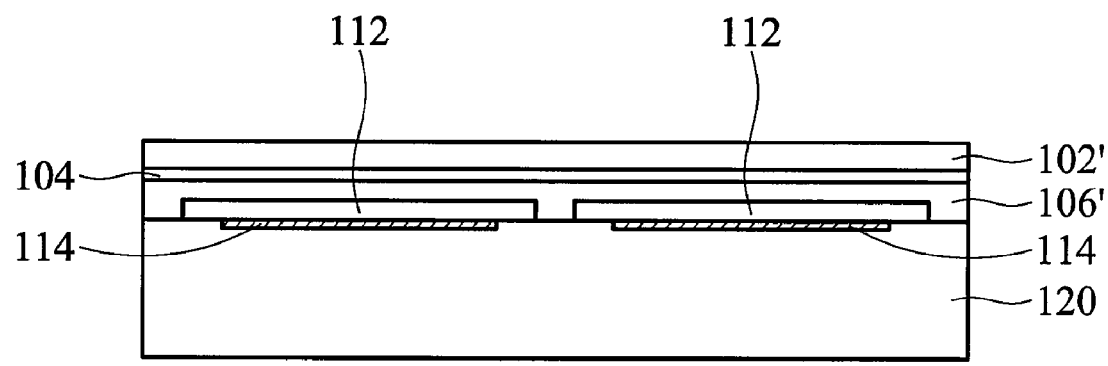

After bonding, the first silicon layer 102 of the SOI wafer 100' located away from the substrate 120 is thinned by grinding or polishing, as illustrated in FIG. 1D. Since the second silicon layer 106' must be thin enough to form a micromachined structure, cracks may occur therefrom due to external mechanical forces applied during grinding or polishing.

Figure 1E:
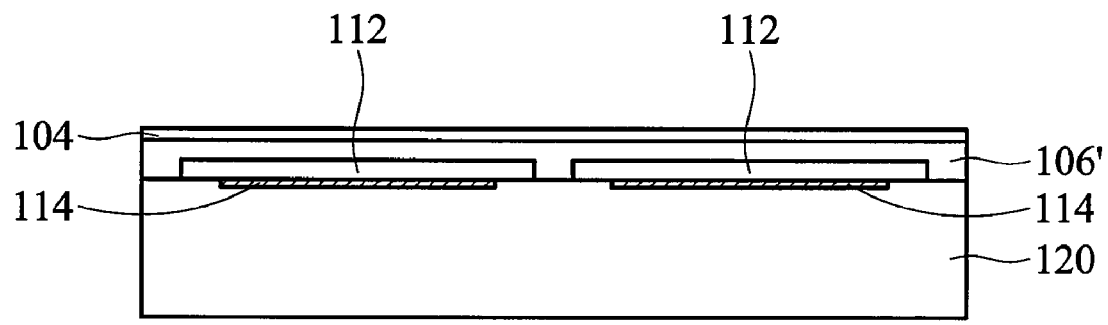

Etching process is then performed to remove the remaining grinded or polished first silicon layer 102', using the insulator layer 104 as an etch stop layer, as illustrated in FIG. 1E. Etching may be accomplished by suitable etching techniques known to those in the art, such as reactive ion etching (RIE).

Figure 1F:
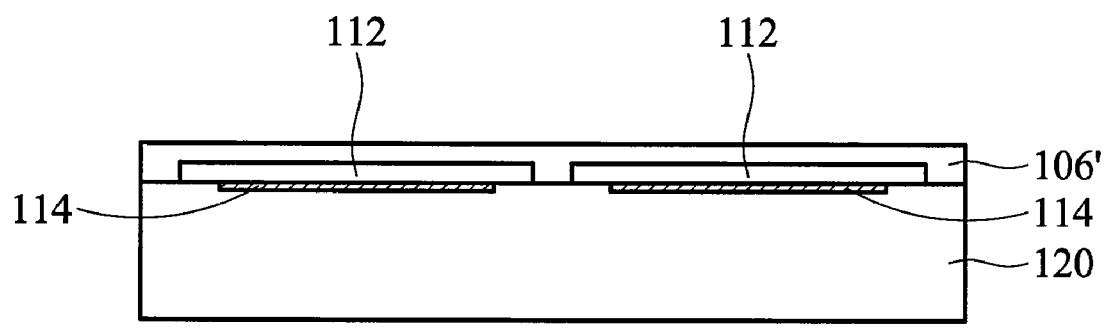

Next, the insulator layer 104 is removed, leaving the second silicon layer 106' with recesses 112 bonded to the substrate 120, as shown in FIG. 1F. In this case, the insulator layer 104, an oxide layer, may be removed by Buffered Oxide Etch Solution (BOE) etching. The second silicon layer 106', a thin silicon cantilevered or suspended structure, can make micromachined structures using technologies for semiconductor integrated circuits, such as photolithographic and etching process. Depending on choices, the thin silicon cantilevered or suspended structure acts as a beam member, mirror element or the like for the micromachined devices that may be actuated by the integrated circuit devices 114 or the like.

In the above method, the micromachined structures are fabricated from a SOI wafer, combining the bonding process with subsequent grinding or polishing, such that the thin silicon cantilevered or suspended structure may crack at wafer edge due to external mechanical forces applied by the grinding or polishing process, causing a large amount of yield loss.

Accordingly, the invention provides a method of forming a micromachined structure, and in particular to a method of forming a micro-electro-mechanical system (MEMS) structure. A processing substrate, such as a SOI wafer, a bulk silicon wafer or stacked layers, having a thin suspended structure for the micromachined structure is thinned by grinding or polishing before the wafer having the thin suspended structure is bonded to a substrate, such as a wafer or glass substrate, with integrated circuit devices.

FIGS. 2A~2H are a series of schematic cross-sections of a method of forming a thin suspended structure from a SOI wafer according to a preferred embodiment of the invention, whereby the problem of cracking is avoided.

Figure 2A:
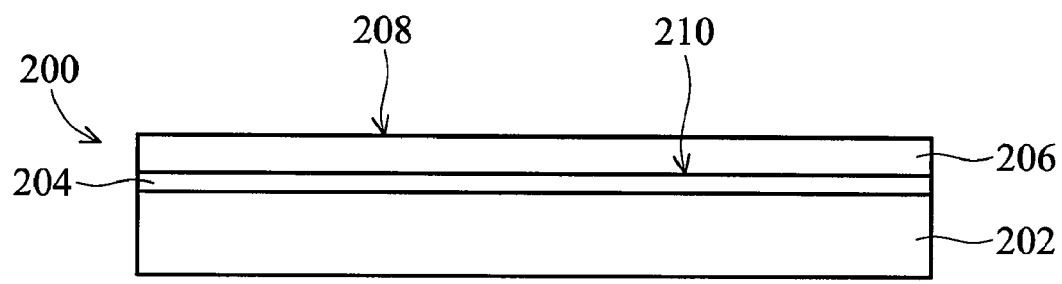
FIGS. 2A~2H are a series of schematic cross-sections of a method of forming a thin suspended structure, in accordance with a preferred embodiment of the invention.

As shown in FIG. 2A, a silicon-on-insulator (SOI) wafer 200 having an insulator layer 204 interposed between a first silicon layer 202 and a second silicon layer 206 is first provided. The second silicon layer 206 has a free surface 208 and a substantially co-planar surface 210 abutting the insulator layer 204. The insulator layer 204 may comprise an oxide layer, such as silicon oxide.

Figure 2B:
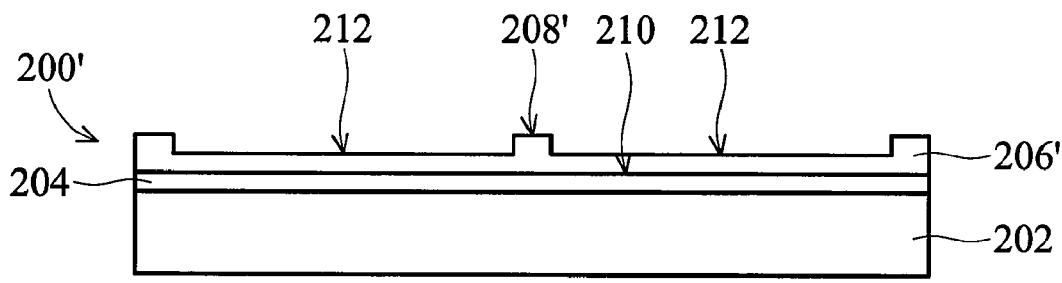

Referring to FIG. 2B, the free surface 208 of the second silicon layer 206 is patterned by photolithography and etching techniques known to those skilled in the art, such that recesses 212 are formed in the patterned free surface 208' of the second silicon layer 206' of the SOI wafer 200'. The second silicon layer 206' with recesses 212 acts as a beam member, mirror element or the like of micromachined devices, which should be thin sufficiently.

Figure 2C:
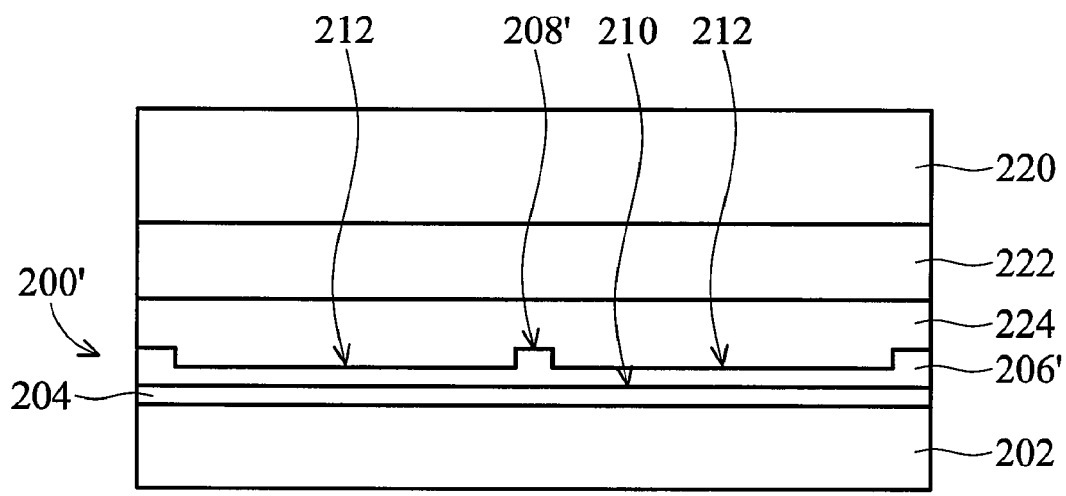

In FIG. 2C, a first handle wafer 220, such as a glass wafer, is provided. The first handle wafer 220 is then adhered to the patterned free surface 208' of the second silicon layer 206' of the SOI wafer 200' via a first adhesive layer 222 such as hot-melt glue. Furthermore, an optional protective layer 224 may be disposed between the patterned free surface 208' of the second silicon layer 206' and the first adhesive layer 222 to protect the second silicon layer 206' from damage by external mechanical forces. The optional protective layer 224 may comprise a photoresist layer.

The first adhesive layer 222 can also provide protection from damage caused by external mechanical forces, such that the protective layer 224 is not necessary.

Figure 2D:
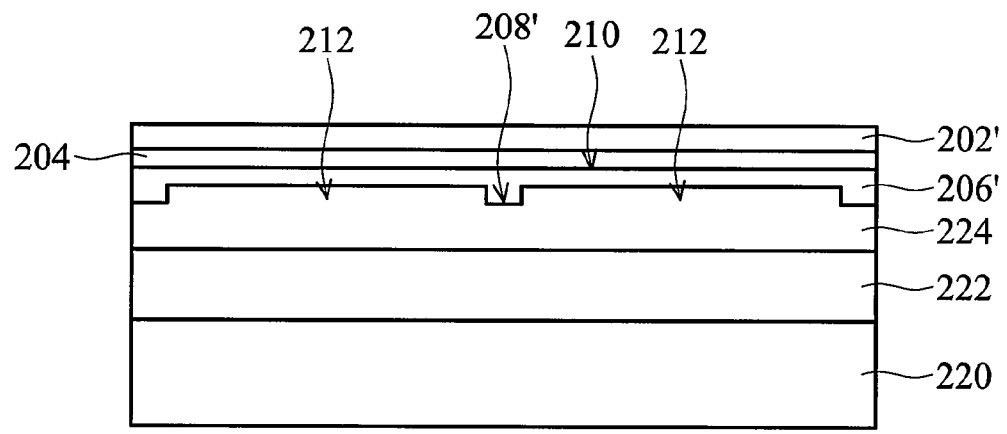

After the first handle wafer 220 adheres to the patterned free surface 208' of the second silicon layer 206', the first silicon layer 202 of the SOI wafer 200' located away from the first handle wafer 220 is thinned by grinding or polishing, as illustrated in FIG. 2D. The first adhesive layer 222 and the optional protective layer 224 can protect the thin patterned second silicon layer 206' used to make a micromachined structure away from cracking during the grinding or polishing process.

Figure 2E:
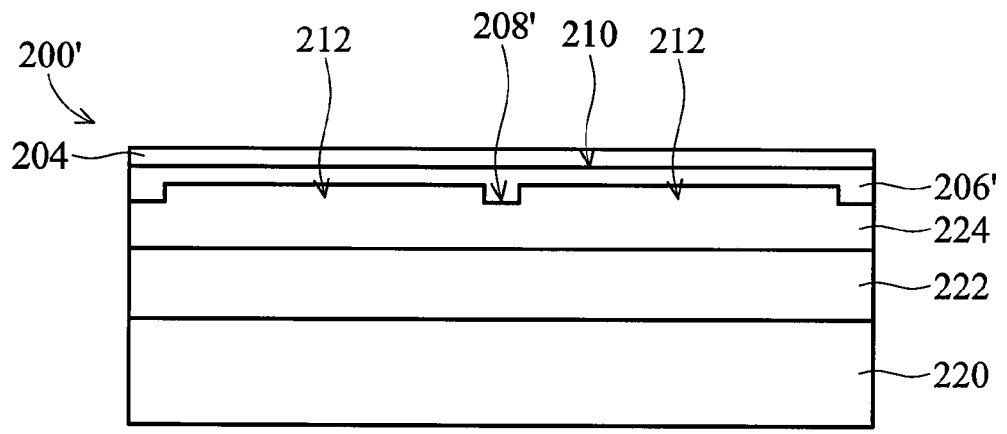

Etching process is then performed to remove the remaining ground or polished first silicon layer 202', using the insulator layer 204 as an etch stop layer, as illustrated in FIG. 2E. Etching may be accomplished by suitable etching techniques known to those in the art, such as reactive ion etching (RIE).

Figure 2F:
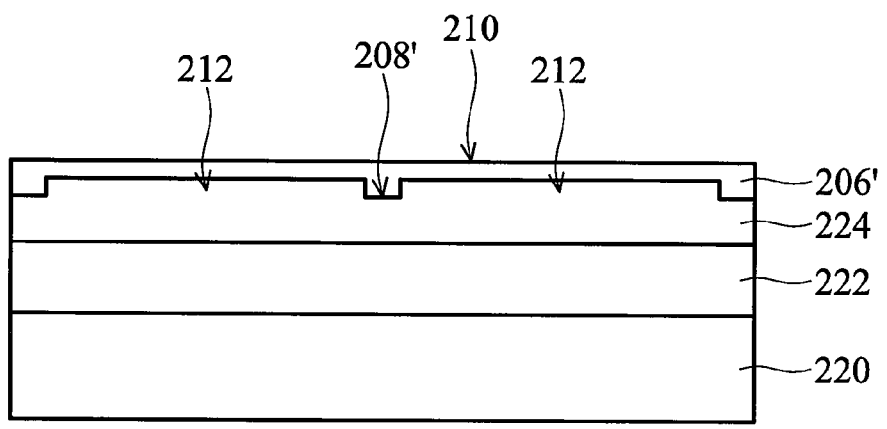

Next, the insulator layer 204 may be removed to expose the surface 210 of the second silicon layer 206', as shown in FIG. 2F. In this case, the insulator layer 204, an oxide layer, may be removed by Buffered Oxide Etch Solution (BOE) etching.

Figure 2G:
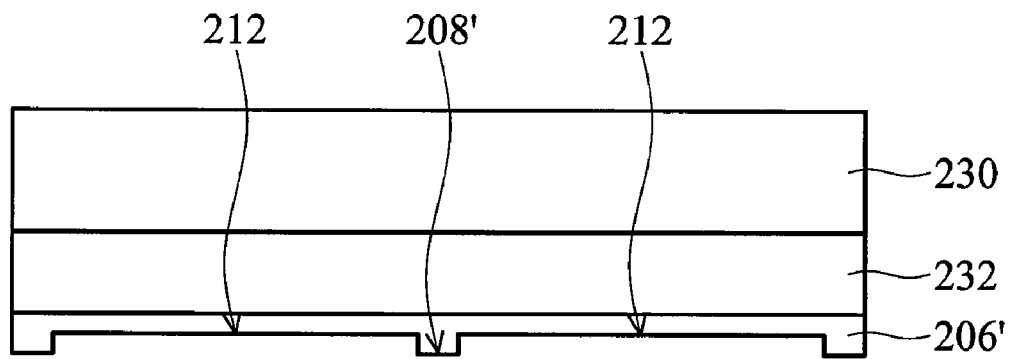

A second handle wafer 230, such as a glass wafer, adheres to the surface 210 of the second silicon layer 206' via a second adhesive layer 232, such as hot-melt glue, at a temperature higher than the step of adhering the patterned free surface 208' of the second silicon layer 206' to the first handle wafer 220 via the first adhesive layer 222, such that the step of adhering the surface 210 of the second silicon layer 206' to the second handle wafer 230 via the second adhesive layer 232 may be accomplished simultaneously with the step of releasing the first adhesive layer 222 from the patterned free surface 208' of the second silicon layer 206', as shown in FIG. 2G.

Figure 2H:
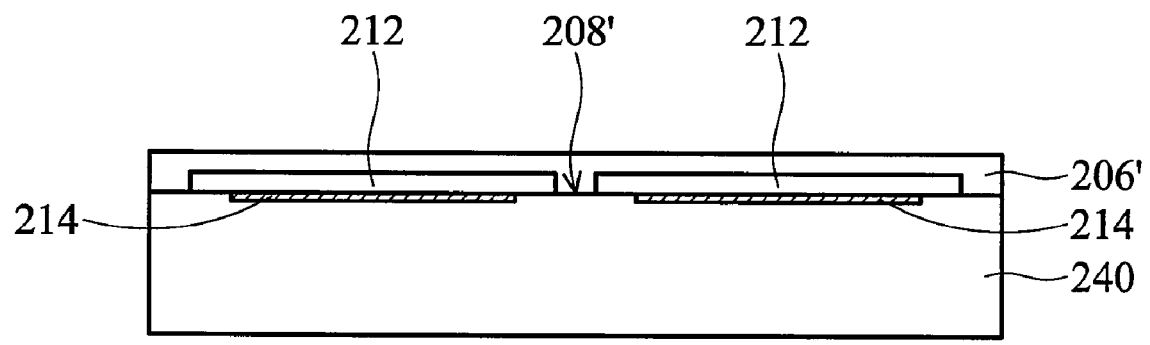

The second handle wafer 230 may provide support for the floppy and fragile second silicon layer 206' bonding to a wafer 240 with integrated circuit devices 214 or the like therein or thereon. The bonding process may comprise an appropriate method such as surface-active bonding (SAB), anodic bonding, adhesives, heat bonding, or any other suitable means. In addition, the second adhesive layer 232 and the second handle wafer 230 are removed from the wafer 240 easily and cleanly by a heat treatment, as shown in FIG. 2H.

The second silicon layer 206' with recesses 212, a thin silicon cantilevered or suspended structure, can be used to make micromachined structures using technologies for semiconductor integrated circuits, such as photolithographic and etch process. Depending on choices, the thin silicon cantilevered or suspended structure acts as a beam member, mirror element or the like of the micromachined devices that may be actuated by the integrated circuit devices 214 or the like.

In view of the extreme fragility of such thin second silicon layer 206', the second silicon layer 206' must be handled with great care before bonding to the substrate 240. The embodiment of the present invention inverts the bonding process and grinding or polishing process, such that problems of cracking at wafer edge can be avoided easily.

FIGS. 3A~3E are a series of schematic cross-sections of a method of forming a thin suspended structure from a silicon wafer according to another embodiment of the invention, whereby the problem of cracking is avoided.

Figure 3A:
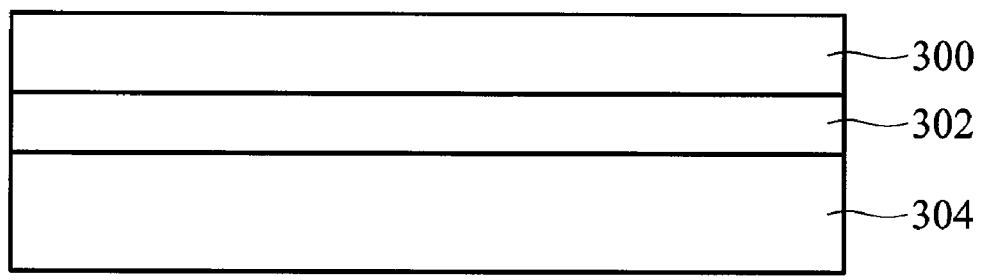
FIGS. 3A~3E are a series of schematic cross-sections of a method of forming a thin suspended structure, in accordance with another preferred embodiment of the invention.
Figure 3B:
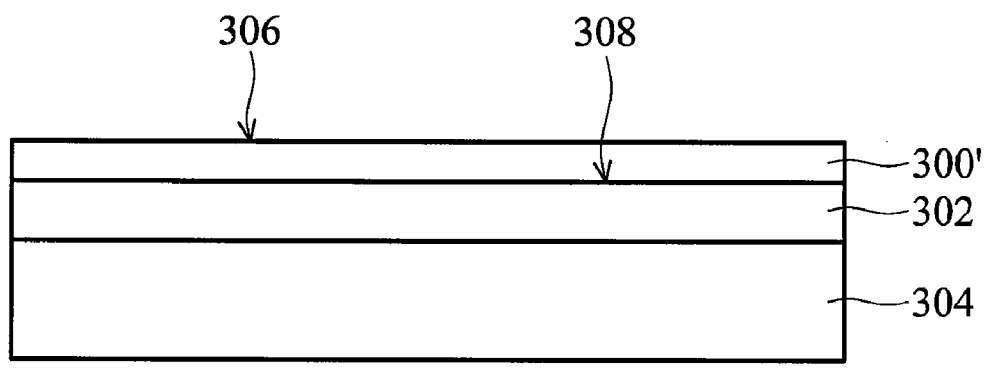

As shown in FIG. 3A, a processing wafer 300, such as a bulk silicon wafer of conventional thickness, is adhered to a handle wafer 304 via an adhesive layer 302. The handle wafer 304 may comprise a glass wafer. The adhesive layer 302 may comprise hot-melt glue. The processing wafer 300 is then thinned by conventional techniques, such as a wet etching process with a suitable etchant, a dry etching process with a reactive gas, or a grinding or polishing process, to a thickness suitable for fabricating micromachined structures, as shown in FIG. 3B.

The thinned processing wafer 300', having a free surface 306 and a substantially co-planar surface 308 abutting the adhesive layer 302, is supported by the handle wafer 304 to avoid cracking.

Figure 3C:
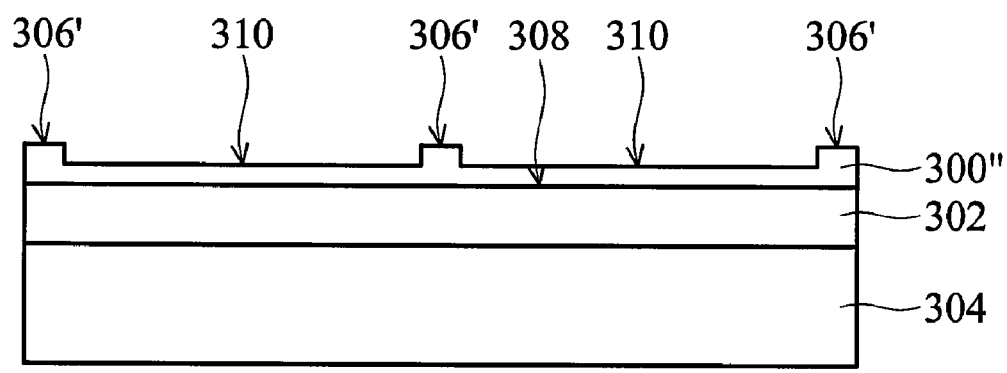

Referring to FIG. 3C, the free surface 306 of the thinned processing wafer 300' is patterned by photolithography and etching techniques known to those skilled in the art, such that the processing wafer 300" with recesses 310 and patterned free surface 306' is obtained. The patterned processing wafer 300" acts be as a beam member, mirror element, or the like of micromachined devices, which should be sufficiently thin.

Figure 3D:
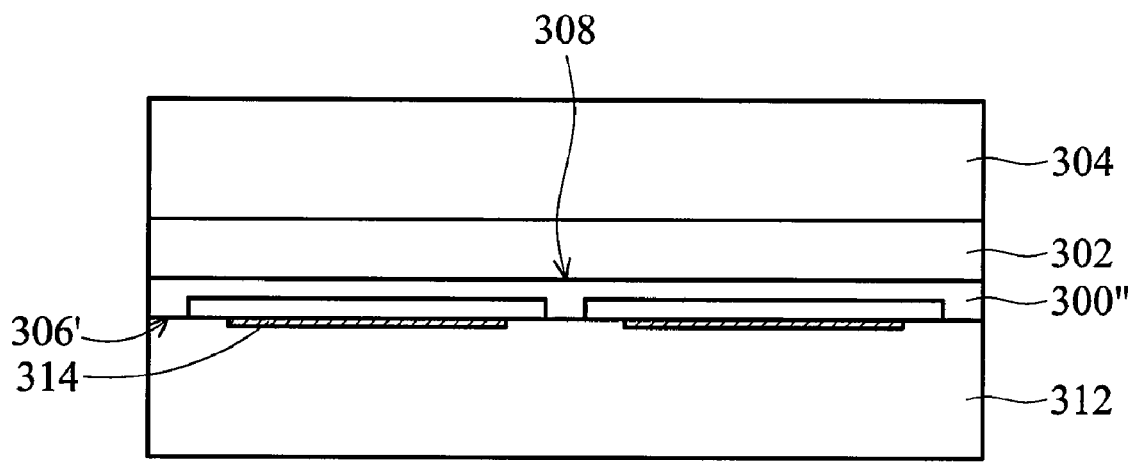
Figure 3E:
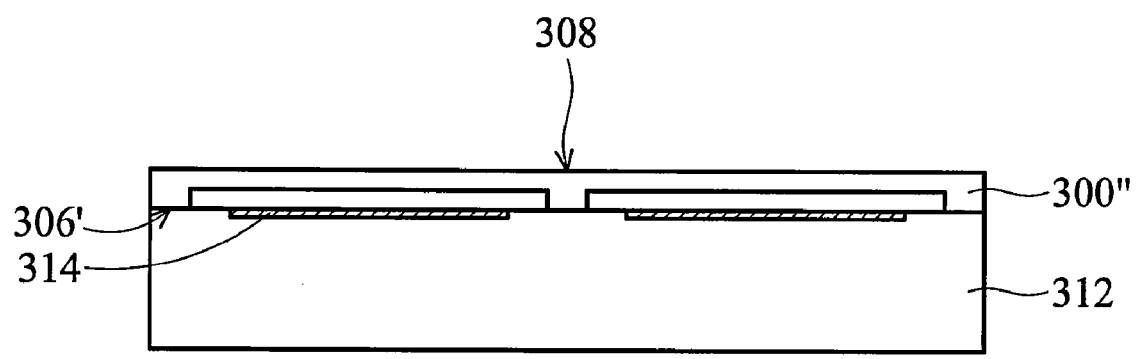

In FIG. 3D, the patterned free surface 306' of the processing wafer 300" is bonded to the supporting wafer 312 with integrated circuit devices 314 or the like therein or thereon. The bonding process may comprise an appropriate method such as surface-active bonding (SAB), anodic bonding, adhesives, heat bonding, or any other suitable means. In addition, the adhesive layer 302 and the handle wafer 304 are removed easily and cleanly by a heat treatment, such that the surface 308 of the patterned processing wafer 300" is exposed, as shown in FIG. 3E.

The patterned processing wafer 300", a thin silicon cantilevered or suspended structure, can be used to form micromachined devices using technologies for semiconductor integrated circuits, such as photolithographic and etching process. Depending on choices, the thin silicon cantilevered or suspended structure acts as a beam member, mirror element or the like of the micromachined devices that may be actuated by the integrated circuit devices 314 or the like.

In view of the extreme fragility of the thin patterned processing wafer 300", the thin patterned processing wafer 300" must be handled with great care before bonding to the supporting wafer 312. Accordingly, the embodiment of the invention provides a method of forming a micromachined structure, such that problems of cracking at wafer edge can be avoided easily.

While the invention has been described by way of example and in terms of preferred embodiments, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a micromachined structure, comprising:
   providing a substrate having an intermediate layer interposed between a first layer and a second layer;
   patterning a free surface of the second layer;
   adhering the patterned free surface of the second layer to a first handle substrate via a first adhesive layer;
   removing the first layer;
   removing the intermediate layer to expose a surface of the second layer;
   releasing the first adhesive layer and the first handle substrate from the patterned free surface of the second layer; and
   bonding the patterned free surface of the second layer to a substrate with integrated circuit devices.

2. The method as claimed in claim 1, further comprising adhering the surface of the second layer to a second handle substrate via a second adhesive layer after removing the intermediate layer to expose the surface of the second layer.

3. The method as claimed in claim 2, wherein adhesion of the surface of the second layer to the second handle substrate via the second adhesive layer is accomplished before the release of the first adhesive layer from the patterned free surface of the second layer.

4. The method as claimed in claim 3, wherein the first adhesive layer and the second adhesive layer are hot-melt glue.

5. The method as claimed in claim 4, wherein adhesion of the surface of the second layer to the second handle substrate via the second adhesive layer is performed at a temperature higher than adhesion of the patterned free surface of the second layer to the first handle substrate via the first adhesive layer.

6. The method as claimed in claim 4, further comprising releasing the second adhesive layer and the second handle substrate from the second layer by a heat treatment.

7. The method as claimed in claim 1, wherein the substrate is a SOI wafer, the intermediate layer is an oxide layer, and the first layer and the second layer are silicon layers.

8. The method as claimed in claim 1, further comprising forming a protective layer between the first adhesive layer and the patterned free surface of the second layer.

9. The method as claimed in claim 8, wherein the protective layer comprises a photoresist layer.

10. The method as claimed in claim 1, wherein removal of the first layer is accomplished by a grinding or polishing process, followed by an etching process.

11. The method as claimed in claim 10, wherein the etching process comprises a reactive ion etch process.

12. The method as claimed in claim 1, wherein bonding of the patterned free surface of the second layer to the substrate is accomplished by surface-active bonding (SAB), anodic bonding, adhesives, or heat bonding.

13. A method for forming a micromachined structure, comprising:
   providing a processing substrate;
   providing a handle substrate;
   adhering the processing substrate to the handle substrate via an adhesive layer;
   thinning the processing substrate;
   patterning a free surface of the processing substrate;
   bonding the patterned free surface of the processing substrate to a substrate with integrated circuit devices; and
   releasing the adhesive layer and the handle substrate from the processing substrate.

14. The method as claimed in claim 13, wherein the processing substrate comprises a silicon wafer.

15. The method as claimed in claim 13, wherein the adhesive layer comprises hot-melt glue.

16. The method as claimed in claim 13, wherein release of the adhesive layer from the processing substrate is accomplished by a heat treatment.

17. The method as claimed in claim 13, wherein thinning of the processing substrate is performed by a wet etching process, a dry etching process, or a grinding or polishing process.

18. The method as claimed in claim 13, wherein bonding of the patterned free surface of the processing substrate to the substrate with integrated circuit devices is accomplished by surface-active bonding (SAB), anodic bonding, adhesives, or heat bonding.

19. The method as claimed in claim 13, comprising the steps in sequence of:
   providing the processing substrate;
   patterning the free surface of the processing substrate;
   providing the handle substrate;
   adhering the processing substrate to the handle substrate via the adhesive layer;
   thinning the processing substrate;
   releasing the adhesive layer and the handle substrate from the processing substrate; and
   bonding the patterned free surface of the processing substrate to the substrate with integrated circuit devices.

20. The method as claimed in claim 19, wherein the processing substrate comprises a wafer having an intermediate layer interposed between a first layer and a second layer.

21. The method as claimed in claim 20, wherein the substrate is a SOI wafer, the intermediate layer is an oxide layer, and the first layer and the second layer are silicon layers.

22. The method as claimed in claim 20, wherein the patterning step comprises patterning a free surface of the second layer, the adhering step comprises adhering the patterned free surface of the second layer to the handle substrate via the adhesive layer, and thinning step comprising removing the first layer and the intermediate layer to expose another surface of the second layer.

23. The method as claimed in claim 22, before releasing the adhesive layer and the handle substrate from the processing substrate, further comprising adhering the another surface of the second layer to another handle substrate via another adhesive layer.

* * * * *